(12) United States Patent
Nevin et al.

(10) Patent No.: US 6,955,988 B2
(45) Date of Patent: Oct. 18, 2005

(54) METHOD OF FORMING A CAVITY AND SOI IN A SEMICONDUCTOR SUBSTRATE

(75) Inventors: William Andrew Nevin, Portadown (GB); Paul Damien McCann, Jordanstown (GB)

(73) Assignee: Analog Devices, Inc., Norwood, MA (US)

( * ) Notice: Subject to any disclaimer, the term of this patent is extended or adjusted under 35 U.S.C. 154(b) by 26 days.

(21) Appl. No.: 10/727,449

(22) Filed: Dec. 4, 2003

(65) Prior Publication Data

US 2005/0124167 A1 Jun. 9, 2005

(51) Int. Cl.⁷ .............................................. H01L 21/311
(52) U.S. Cl. ........................ 438/700; 438/735; 438/749
(58) Field of Search ................................ 438/455, 456, 438/459, 526, 700, 735, 749, 914, 977

(56) References Cited

U.S. PATENT DOCUMENTS 6,004,406 A * 12/1999 Kobayashi et al. ........ 148/33.3
6,417,075 B1 * 7/2002 Haberger et al. ........... 438/459

* cited by examiner

*Primary Examiner*—Phuc T. Dang
(74) *Attorney, Agent, or Firm*—Gauthier & Connors LLP

(57) ABSTRACT

A semiconductor substrate (1) comprising an SOI (2) formed therein. The semiconductor substrate (1) comprises first and second wafers (4,6) which are directly bonded together along a bond interface (9). Prior to bonding the wafers (4,6), a portion (15) of the second wafer (6) is ion implanted to form a p+ region for facilitating selective etching thereof to form a buried cavity (16), in which a buried insulating layer is subsequently formed under a portion (10) of the first wafer (4) for forming the SOI (2). After bonding of the first and second wafers (4,6) a communicating opening (20) is etched through the first wafer (4) to the bond interface (9), and the selectively etchable portion (15) is etched through the communicating opening (20) to form the buried cavity (16). The buried cavity (16) is then filled with deposited oxide to form the buried insulating layer (11). An isolation trench (12) is formed through the first wafer (4) to the buried insulating layer (11) around the portion (10) for isolating the SOI (2) from the remainder of the first wafer (4).

47 Claims, 6 Drawing Sheets

METHOD OF FORMING A CAVITY AND SOI IN A SEMICONDUCTOR SUBSTRATE

FIELD OF THE INVENTION

The present invention relates to a method for forming a buried cavity in a semiconductor substrate, and to a method for forming an SOI in the semiconductor substrate. The invention also relates to a semiconductor substrate having a buried cavity formed therein, and to a semiconductor substrate having an SOI formed therein.

BACKGROUND OF THE INVENTION

Semiconductor substrates formed by direct bonded semiconductor wafers, for example, direct bonded single crystal silicon wafers are commonly used in the manufacture of power devices such as PIN diodes, insulated gate bipolar transistors, as well as photo-detectors and micro-electromechanical systems (MEMS). The advantage of forming PIN diodes, insulated gate bipolar transistors, photo-detectors and other such semiconductor electronic devices in directly bonded silicon wafers is that it avoids the need to form a deposited silicon (epitaxy) layer on a silicon wafer in which the power devices are to be formed. Single crystal silicon has fewer defects than epitaxial silicon, and furthermore, thick epitaxial silicon layers can be expensive to produce. Semiconductor substrates formed by silicon-to-silicon bonded single crystal composite wafers allow layers with a wide range of dopant levels to be produced, thus increasing the efficiency of the power devices fabricated in the substrate.

However, in certain cases, in order to integrate power devices with controlling electronic devices for smart power applications, it is desirable to provide SOI structures alongside the bulk-silicon-based devices, for example, for use in the fabrication of MEMS, CMOS or bipolar devices. In general, where such SOI structures are required in discrete areas of a direct bonded semiconductor substrate, it is necessary to etch wells in one of the wafers prior to bonding in areas which correspond to where the SOIs are required. The wells are filled with an insulating material, for example, oxide, and the wafer with the insulation filled wells must then be ground, etched and/or polished to provide a planar surface suitable for bonding to the other wafer. When the two wafers are bonded together, the oxide filled wells form buried oxide layers beneath the wafer in which the devices are to be formed, thereby forming a structure commonly known as a partial SOI. This method for forming a partial SOI in a semiconductor substrate formed by directly bonded wafers suffers from a number of disadvantages. In general, it is difficult to achieve a planar surface across an oxide-silicon boundary, and thus it is virtually impossible to achieve a good bond between the surfaces of the wafers along the bond interface. Accordingly, voids and other defects are commonly formed along the bond interface between the directly bonded wafers. The existence of such voids and other defects leads to problems in the subsequent doping of the substrate, and also leads to current leakage from electronic devices subsequently formed in the substrate. Additionally, this method for forming a partial SOI in a semiconductor substrate formed by directly bonded wafers is also cumbersome, time consuming and expensive.

Additionally, in the formation of semiconductor substrates formed by directly bonded wafers it is commonly required to provide a buried cavity formed in the semiconductor substrate. In general, this requires etching a recess into the surface of one of the wafers prior to bonding of the wafers together, so that when the wafers are bonded together with the surface into which the recess has been etched forming one of the surfaces of the bond interface between the wafers, the recess forms the buried cavity. A problem with this method for forming a buried cavity in such a semiconductor substrate is that gas which is in the recess expands during the high temperature anneal bonding, which in some cases prevents bonding of the wafers together, and in other cases leads to the formation of voids between the surfaces of the bond interface. Additionally, it is difficult to accurately locate the buried cavity relative to the portion of the wafer which in use is above the cavity.

There is therefore a need for a method for forming a semiconductor substrate having a partial SOI formed therein which overcomes the problems of prior art methods, and there is also a need for providing a semiconductor substrate having a partial SOI formed therein which overcomes the problems of such known semiconductor substrates. There is also a need for a method for forming a semiconductor substrate having a buried cavity formed therein which overcomes the problems of known methods for forming semiconductor substrates with buried cavities therein, and there is a need for a semiconductor substrate having a buried cavity formed therein which overcomes the problems of known semiconductor substrates with a buried cavity formed therein.

The present invention is directed towards a method for forming a semiconductor substrate having a partial SOI formed therein, and to a method for forming a semiconductor substrate having a buried cavity formed therein. The invention is also directed towards a semiconductor substrate having a partial SOI formed therein and a semiconductor substrate having a buried cavity formed therein.

SUMMARY OF THE INVENTION

According to the invention there is provided a method for forming a buried cavity in a semiconductor substrate formed by at least a first wafer and a second wafer both of semiconductor material directly bonded along a bond interface, the method comprising the steps of:

treating one of the first and second wafers to be selectively etchable adjacent a surface thereof to form a selectively etchable portion prior to bonding of the first and second wafers, bonding the first and second wafers together with the surface of the one of the first and second wafers adjacent which the portion of the wafer is selectively etchable forming with a surface of the other of the first and second wafers the bond interface, forming a communicating opening through the first wafer to the selectively etchable portion, and etching the selectively etchable portion to form the buried cavity beneath the first wafer.

In one embodiment of the invention the one of the first and second wafers which is treated to be selectively etchable is treated through the surface thereof which is to form the bond interface.

In another embodiment of the invention the one of the first and second wafers which is treated to be selectively etchable is treated by doping. Preferably, the one of the first and second wafers which is treated to be selectively etchable is doped by ion implantation through the surface which is to form the bond interface. Alternatively, the one of the first and second wafers which is treated to be selectively etchable is doped by atom diffusion through the surface which is to form the bond interface.

In one embodiment of the invention the one of the first and second wafers which is treated to be selectively etchable is of p type material, and the wafer is doped to form the selectively etchable portion as a p+ region. Preferably, the one of the first and second wafers which is to be treated to be selectively etchable is doped by boron, or species thereof.

In another embodiment of the invention the one of the first and second wafers which is treated to be selectively etchable is of n type material, and the wafer is doped to form the selectively etchable portion as a n+ region. Preferably, the one of the first and second wafers which is treated to be selectively etchable is doped by a dopant selected from one or more of the following dopants:

phosphorous,
arsenic, and
antimony,
or species thereof.

Preferably, the one of the first and second wafers which is treated to be selectively etchable is doped at a level greater than $10^{18}$ atoms per cc.

Advantageously, the one of the first and second wafers which is treated to be selectively etchable is treated so that the depth of the selectively etchable portion corresponds to the desired depth of the buried cavity.

In one embodiment of the invention the one of the first and second wafers which is treated to be selectively etchable is treated so that the area of the selectively etchable portion corresponds to the desired area of the buried cavity.

In another embodiment of the invention the one of the first and second wafers which is treated to be selectively etchable is treated so that the area of the selectively etchable portion extends substantially over the entire bond interface.

In a further embodiment of the invention the second wafer is treated to be selectively etchable in its entirety, and a third wafer of semiconductor material is bonded to the second wafer so that the second wafer is sandwiched between the third wafer and the first wafer. Preferably, the third wafer is directly bonded to the first wafer.

In one embodiment of the invention the second wafer is treated to be selectively etchable. In another embodiment of the invention the first wafer is treated to be selectively etchable. In a further embodiment of the invention the first and the second wafer are treated to be selectively etchable, and the first and second wafers are bonded together with their respective surfaces which are adjacent the portions thereof which are selectively etchable forming the bond interface.

In a further embodiment of the invention the selectively etchable portion is etched by a wet etch to form the buried cavity.

Preferably, the communicating opening is formed in the first wafer by etching. Advantageously, the communicating opening is etched in the first wafer by a reactive ion etch (RIE).

In one embodiment of the invention an etch stop is formed in the selectively etchable portion for defining the area of the buried cavity prior to etching of the selectively etchable portion for limiting the etch in a lateral direction to form the buried cavity.

Preferably, the etch stop is formed in the selectively etchable portion after bonding of the wafers. Advantageously, an etch stop forming trench is formed through one of the wafers into the selectively etchable portion, and an etch stop material is located in at least the portion of the etch stop forming trench in the selectively etchable portion for forming the etch stop.

In one embodiment of the invention the etch stop forming trench is formed by etching. Preferably, the etch stop forming trench is etched by an RIE etch.

In another embodiment of the invention the etch stop forming trench is formed in the first wafer.

In one embodiment of the invention the communicating opening is formed in the first wafer adjacent the centre of the area of the first wafer which is to be above the buried cavity, and the buried cavity is formed radiating laterally outwardly from and around the communicating opening.

In another embodiment of the invention a pair of communicating openings are formed in the first wafer spaced apart from each other.

In a further embodiment of the invention the buried cavity is at least partially filled with an electrically insulating material for forming a buried insulating layer beneath the first wafer for forming with a portion of the first wafer above the buried insulating layer a semiconductor-on-insulator (SOI). Preferably, the electrically insulating material with which the buried cavity is at least partially filled is an oxide.

In one embodiment of the invention the electrically insulating material with which the buried cavity is at least partially filled is deposited in the buried cavity. Alternatively, the electrically insulating material with which the buried cavity is at least partially filled is grown in the buried cavity.

In one embodiment of the invention an electrical isolation trench is formed in the first wafer for electrically isolating an area of the first wafer above the buried cavity. Preferably, the electrical isolation trench is at least partly filled with an electrically insulating material.

In one embodiment of the invention the communicating opening is located to form a part of the electrical isolation trench. Preferably, the portion of the electrical isolation trench which is not formed by the communicating opening, is formed after filling of the buried cavity with the electrically insulating material.

In one embodiment of the invention each communicating opening is at least partially filled with an electrically insulating material.

In another embodiment of the invention each communicating opening is filled with an electrically insulating material.

In a further embodiment of the invention each communicating opening is at least partially filled with polysilicon.

In a still further embodiment of the invention each communicating opening is filled with polysilicon.

In another embodiment of the invention a plurality of discrete buried cavities are formed in the semiconductor substrate. Preferably, at least some of the buried cavities are at least partially filled with the electrical insulating material for forming a plurality of discrete SOIs.

Advantageously, the first wafer is thinned after the buried cavity has been formed.

In another embodiment of the invention each wafer is of single crystal silicon material.

The invention also provides a semiconductor substrate having a buried cavity therein, the semiconductor substrate being formed by the method according to the invention.

The invention also provides a semiconductor substrate having an SOI formed therein, the SOI being formed by the method according to the invention.

Further, the invention provides a semiconductor substrate having a buried cavity therein, the semiconductor substrate comprising:
  a first wafer of semiconductor material,
  a second wafer of semiconductor material directly bonded to the first wafer along a bond interface,
  one of the first and second wafers having been treated to form a selectively etchable portion adjacent a surface thereof prior to bonding of the first and second wafers, and the buried cavity having been etched in the selectively etchable portion beneath the first wafer through a communicating opening formed in the first wafer.

Additionally, the invention provides a semiconductor substrate having an SOI formed therein, the substrate comprising:

a first wafer of semiconductor material, a second wafer of semiconductor material directly bonded to the first wafer along a bond interface, one of the first and second wafers having been treated to form a selectively etchable portion adjacent a surface thereof prior to bonding of the first and second wafers, a buried cavity having been etched in the selectively etchable portion beneath the first wafer through a communicating opening formed in the first wafer, and an electrically insulating layer formed in the buried cavity for forming with a portion of the first wafer above the buried insulating layer the SOI.

ADVANTAGES OF THE INVENTION

The advantages of the invention are many. In the case of the semiconductor substrate having an SOI formed therein according to the invention, by virtue of the fact that the buried insulating layer is formed in the semiconductor substrate after direct bonding of the first and second wafers, the SOI can be accurately located in the semiconductor substrate. Additionally, by treating one of the first and second wafers to be selectively etchable, etching of the buried cavity, and in turn formation of the buried oxide layer can readily easily be carried out after the first and second wafers have been directly bonded together.

Additionally, the semiconductor substrate according to the invention is particularly suitable for use in the manufacture of integrated circuits which require power devices, such as PIN diodes, insulated gate bipolar transistors, as well as photo-detectors and MEMS devices, and/or electronic devices such as CMOS and bipolar devices, and the location of such devices can be readily easily and accurately formed on the composite wafer.

A particularly important advantage of the invention where the method according to the invention is used to form a semiconductor substrate having an SOI formed therein is that the formation of interfacial voids and other defects along the bond interface between the directly bonded first and second wafers is eliminated. This is due to the fact that the bonding of the first and second wafers is carried out before forming the SOI structure or cavity, and accordingly, the surfaces of the first and second wafers which are bonded together are planar surfaces of semiconductor material only. Thus, since the surfaces to be bonded together are free of oxide-silicon boundaries, the formation of interfacial voids and other defects which occur in prior art methods where the buried oxide layer is formed prior to bonding the first and second wafers together is eliminated.

The method according to the invention also provides many advantages where the semiconductor substrate is formed with a buried cavity therein according to the invention. By virtue of the fact that the buried cavity is formed after the wafers have been bonded together, there is no problem of gas expansion during high temperature anneal bonding, which would prevent bonding or lead to the formation of voids along the bond interface. Additionally, the buried cavity can be accurately located relative to the portion of the first wafer which is above the cavity, due to the fact that the cavity is formed after bonding of the first and second wafers together, and furthermore, by virtue of the fact that the surfaces of the first and second wafers to be bonded together can be made completely planar, accurate direct bonding of the first and second wafers can be carried out without any danger of interfacial voids or other defects being formed along the bond interface.

The invention and its many advantages will be readily apparent from the following description of some preferred embodiments thereof, which are given by way of non-limiting example.

DETAILED DESCRIPTION OF PREFERRED EMBODIMENTS OF THE INVENTION

Figure 2:
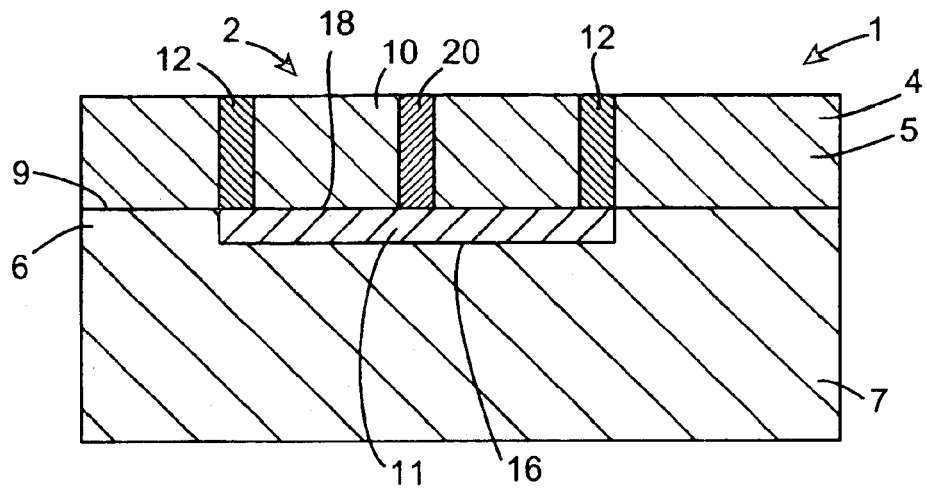
FIG. 2 is a transverse cross-sectional side elevational view of the semiconductor substrate on the line II—II of FIG. 1.
Figure 1:
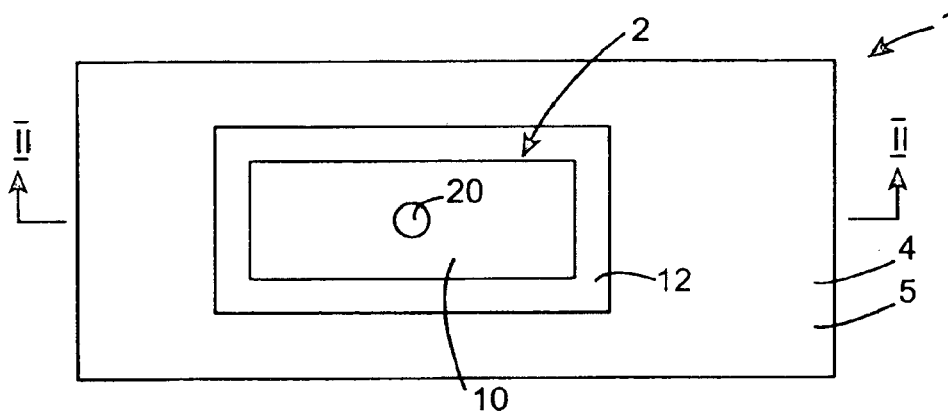
FIG. 1 is a top plan view of a semiconductor substrate according to the invention having an SOI formed therein.

Referring to the drawings and initially to FIGS. 1 to 6, there is illustrated a semiconductor substrate according to the invention, indicated generally by the reference numeral 1, which comprises a silicon-on-insulator (SOI) 2 formed therein. The semiconductor substrate 1 is formed by a method which is also according to the invention. The semiconductor substrate 1 comprises a pair of semiconductor wafers, namely, a first wafer 4 which forms a device layer 5 of the semiconductor substrate 1 and a second wafer 6 which forms a handle layer 7. The first and second wafers 4 and 6 are of single crystal silicon and are directly bonded together by high temperature anneal bonding along a bond interface 9. The SOI 2 is formed by a portion 10 of the first wafer 4 beneath which a laterally extending buried insulating layer 11 is formed as will be described below. An electrical isolation trench 12 extends around the portion 10 of the first wafer 4 which forms the partial SOI 2 for insulating the partial SOI 2 from the remainder of the first wafer 4.

The method for forming the composite wafer 1 will now be described. Initially, prior to bonding the first and second wafers 4 and 6 together along the bond interface 9, the second wafer 6 is treated to form a selectively etchable portion 15, which is of area and depth corresponding to the desired area and depth of the buried insulating layer 11, so that when the first and second wafers 4 and 6 are bonded together, the portion 15 can be etched to form a buried cavity 16, within which the buried insulating layer 11 is formed, see FIGS. 3 and 4. In this embodiment of the invention the second wafer is of p type silicon, and is treated by being doped with a suitable dopant for forming the portion 15 as a p+ region, in order to facilitate selective etching thereof. The portion 15 is subjected to ion implantation through a surface 18 which is to form the bond interface 9. Initially the surface 18 is appropriately masked, with an unmasked area corresponding to the area of the buried insulating layer 11 exposing the portion 15. The portion 15 is then ion implanted through the unmasked area of the surface 18 to a depth corresponding to the depth of the buried insulating layer 11. In this embodiment of the invention the dopant is boron, and the portion 15 is highly doped to a level of $10^{19}$ atoms/cc of the portion 15 by ion implantation.

Figure 4:
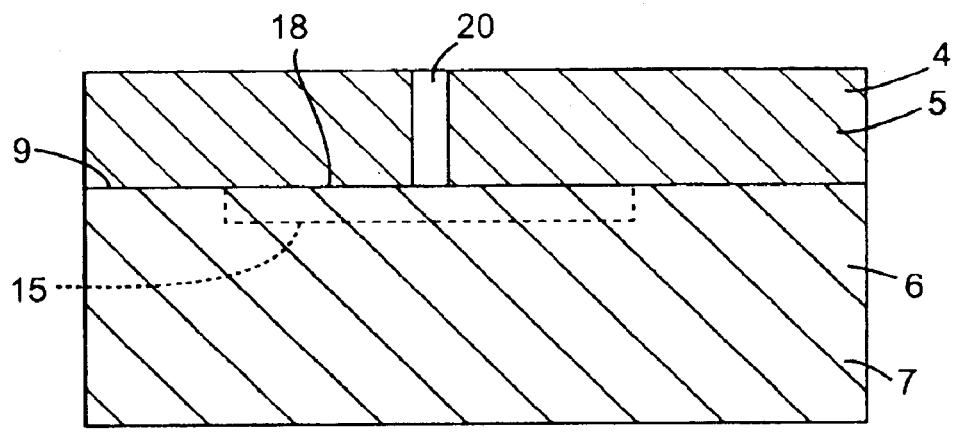
FIG. 4 is a transverse cross-sectional side elevational view similar to FIG. 2 of the semiconductor substrate of FIG. 1 being formed.

After doping the portion 15 to be a p+ region, the first and second wafers 4 and 6 are bonded together along the bond interface 9, with the surface 18 of the second wafer 6 forming one of the surfaces of the bond interface 9, see FIG. 4. The first and second wafers 4 and 6 are directly bonded together by a high temperature anneal bonding, which typically, is carried out at a temperature of the order of 1,150° C. for an appropriate period of time. Prior to bonding, if necessary the surface 18 of the second wafer 6 and the corresponding surface of the first wafer 4 which are to form the bond interface 9 may be ground and polished to provide a good bond interface 9.

Figure 5:
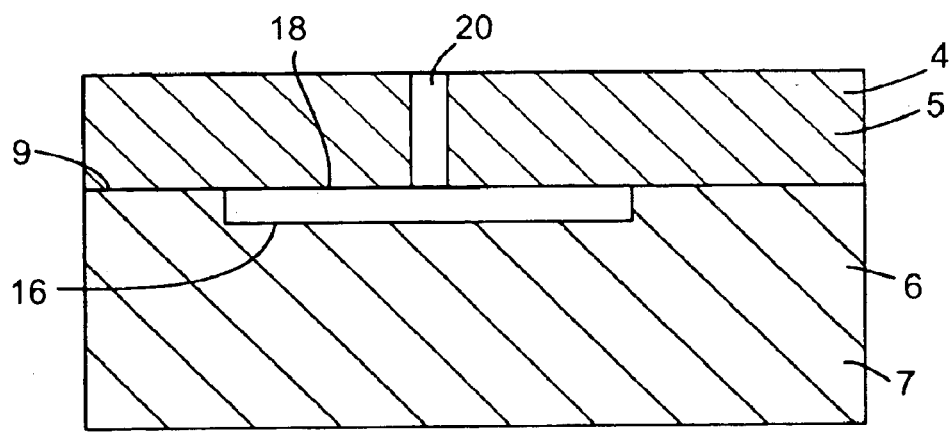
FIG. 5 is a view similar to FIG. 4 of the semiconductor substrate of FIG. 1 also being formed.
Figure 6:
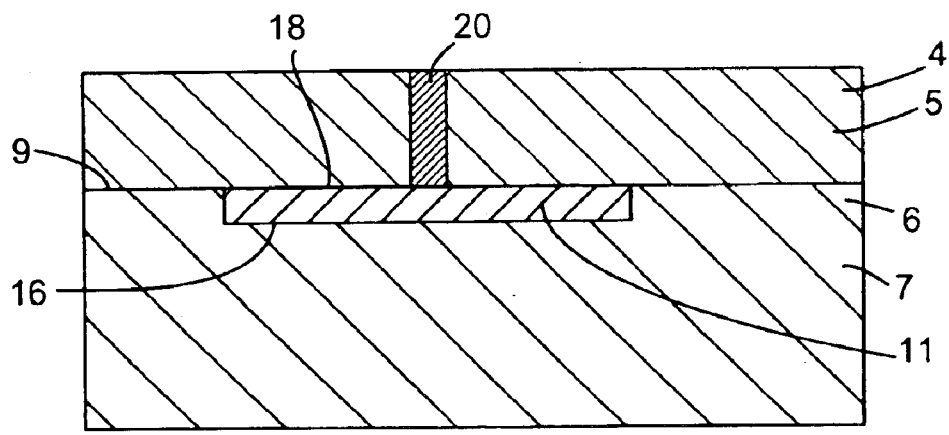
FIG. 6 is a view similar to FIG. 4 of the semiconductor substrate also being formed.
Figure 8:
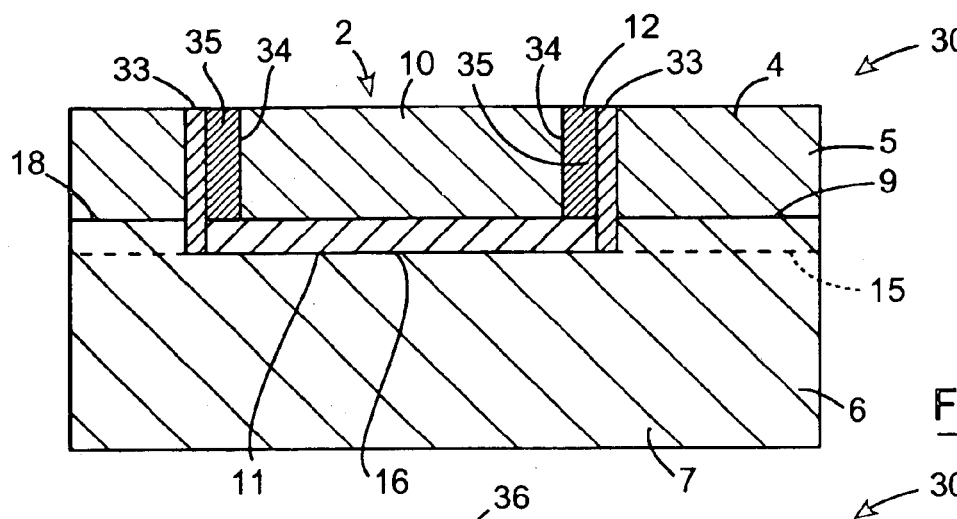
FIG. 8 is a transverse cross-sectional side elevational view of the semiconductor substrate of FIG. 7 on the line VIII—VIII of FIG. 7.
Figure 7:
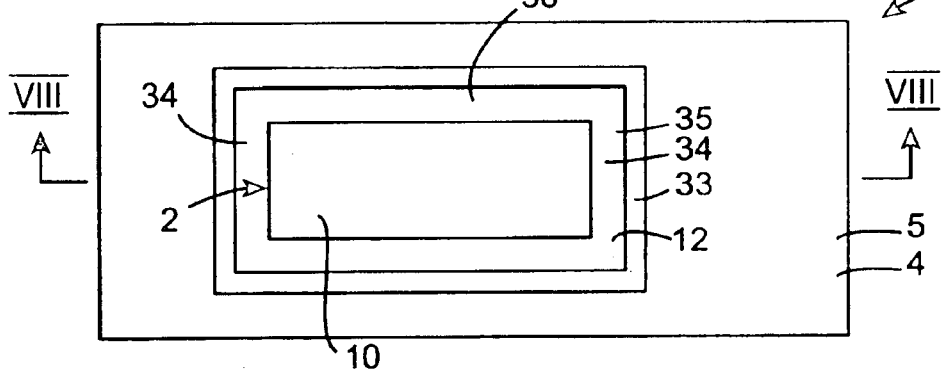
FIG. 7 is a top plan view of a semiconductor substrate according to another embodiment of the invention having an SOI formed therein.

A communicating opening 20 is etched through the first wafer 4 to the bond interface 9 by a suitable etching process, typically, an anisotropic RIE etch, see FIG. 5. Typically, the communicating opening 20 will be of circular diameter and of relatively small bore for facilitating subsequent etching of the selectively etchable portion 15 of the second wafer 6 therethrough. However, the diameter of the communicating opening 20 is sufficient to allow subsequent filling or partial filling, as the case may be, of the buried cavity 16 for forming the buried insulating layer 11. On completion of the communicating opening 20 the selectively etchable portion 15 is laterally etched by a wet etch, for example, a hydrofluoric acid, acetic acid and nitric acid etch, with the hydrofluoric acid, acetic acid and nitric acid of the etch being in the proportion 1:8:3 to form the buried cavity 16 which extends laterally beneath the portion 10, which is to subsequently form the SOI 2, see FIG. 5. Etching of the selectively etchable portion 15 is continued until the portion 15 has been removed, and the buried cavity 16 is of area and depth corresponding to the desired area and depth of the buried insulating layer 11. Once etching of the selectively etchable portion 15 has been completed, the buried cavity 16 is filled with an electrically insulating material, in this embodiment of the invention an oxide, which is deposited by chemical vapour deposition, see FIG. 6. The deposition of the oxide is carried out using a high conformality deposition process in order to minimise bread-loafing of the oxide adjacent the entry into the communicating opening 20, which would otherwise close the communicating opening 20 prior to the buried cavity being completely filled with the deposited oxide. The remainder of the communicating opening 20 which is not filled with oxide after the buried cavity 16 has been filled may be further filled with oxide or by polysilicon, depending on the use to which it is intended to put the SOI 2.

After filling of the buried cavity 16 with the oxide to form the buried insulating layer 11, the portion 10 of the first wafer 4 is supported on the buried insulating layer 11. At this stage, the electrical isolation trench 12 is etched into the first wafer 4 to the buried insulating layer 11 and extends completely around the portion 10 of the first wafer 4, which forms the SOI 2, see FIGS. 1 and 2. The isolation trench 12 is etched using an anisotropic RIE etch. On completion of the etching of the isolation trench 12, the isolation trench 12 is appropriately filled with an insulating material, in this embodiment of the invention oxide, which may be thermally grown or deposited. If desired, one or more lining layers of oxide may be formed to line the walls of the isolation trench 12, and once lined with-the oxide lining layer or layers, the remainder of the isolation trench 12 may be filled with polysilicon.

It will be understood by those skilled in the art that the communicating opening 20 may be filled before or after formation of the isolation trench 12, or may be filled simultaneously during filling of the isolation trench 12. Once the filling of the isolation trench 12 and the communicating opening has been completed, the first wafer 4 may be thinned to form the device layer 5 to the desired thickness. The thinning of the first wafer 4 may be carried out by any suitable process, for example, machining by grinding and/or polishing, or by etching and polishing, or by any other suitable process. After thinning of the first wafer 4, the semiconductor substrate 1 with the SOI 2 formed therein is completed, and the semiconductor substrate 1 may then be further processed for forming semiconductor electronic devices, MEMS devices and the like.

It should, however, be understood that while the semiconductor substrate 1 has been described and illustrated as comprising a single SOI 2, in general, the semiconductor substrate 1 will be formed with a plurality of discrete SOIs 2.

It will be appreciated that while the first and second wafers 4 and 6, and in turn the semiconductor substrate has been illustrated as being of rectangular shape, in general, the wafers will be of substantially circular disc shape and typically will be of diameter in the range of 100 mm to 300 mm. Typically, the first and second wafers will be of depth in the range of 300 to 1,000 microns, and prior to bonding or subsequent to bonding may be ground to any desired depth. However, typically, the second wafer 6 which ultimately forms the handle layer 7 will not be machined until after the semiconductor substrate with the SOI 2 has been formed. The first wafer 4 may be ground and polished prior to etching the communicating opening 20, or subsequent to the formation of the SOI 2, or at any other appropriate time during the formation of the semiconductor substrate 1. The area of the partial SOI 2 will depend on the use to which the SOI 2 is to be put.

Referring now to FIGS. 7 to 10, there is illustrated a semiconductor substrate according to another embodiment of the invention, indicated generally by the reference numeral 30. The semiconductor substrate 30 is substantially similar to the semiconductor substrate 1 and similar components are identified by the same reference numerals. The main difference between the semiconductor substrate 30 and the semiconductor substrate 1 is in the formation of the SOI 2. The first and second wafers 4 and 6 are similar to the first and second wafers 4 and 6 of the semiconductor substrate 1, and the second wafer 6 is doped by ion implantation through the surface 18 to form the selectively etchable portion 15 to be a p+ region. However, in this embodiment of the invention the selectively etchable portion 15 extends over the entire area of the second wafer 6, which is to form the bond interface 9. The selectively etchable portion 15 is formed to correspond to the desired depth of the buried insulating layer 11. After doping and forming of the selectively etchable portion 15, the first and second wafers 4 and 6 are directly bonded together along the bond interface 9 by high temperature bond annealing as already described with reference to the semiconductor wafer 1, see FIG. 9. Because the selectively etchable portion 15 extends over the entire area of the second wafer 6 adjacent the bond interface 9, prior to etching a portion 31 of the selectively etchable portion 15 to form the buried cavity 16, an etch stop is formed through the first wafer 4 into the selectively etchable portion 15 around the portion 10 which is to form the SOI 2, in order to limit the etching of the selectively etchable portion 15 to the portion 31, to in turn form the buried cavity 16. To form the etch stop, an etch stop forming trench 33 is etched through the first wafer 4 and into the second wafer 6 to the depth of the selectively etchable portion 15. The etch stop forming trench 33 is formed by an anisotropic RIE etch, and extends around the portion 10. The etch stop forming trench 33 is then filled with an etch stop material, in this embodiment of the invention an oxide, which may be deposited or thermally grown, see FIGS. 9 and 10.

Figure 9:
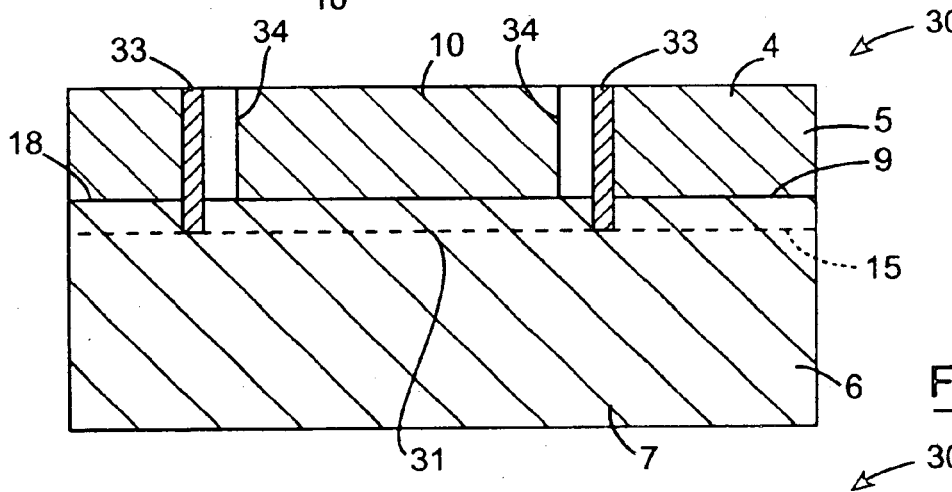
FIG. 9 is a transverse cross-sectional side elevational view similar to FIG. 8 of the semiconductor substrate of FIG. 7 being formed.
Figure 10:
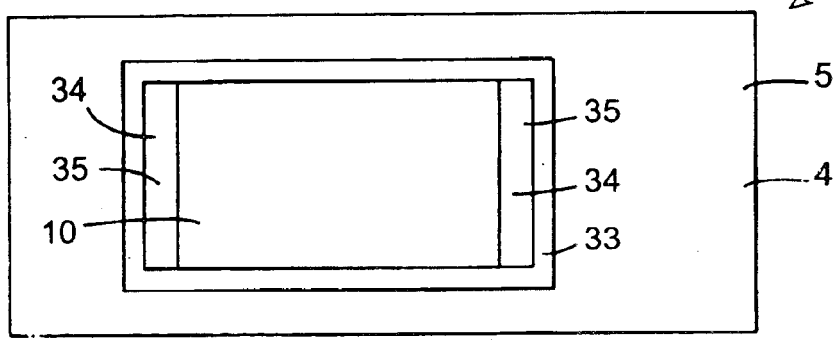
FIG. 10 is a top plan view of the semiconductor substrate of FIG. 7 also being formed.
Figure 12:
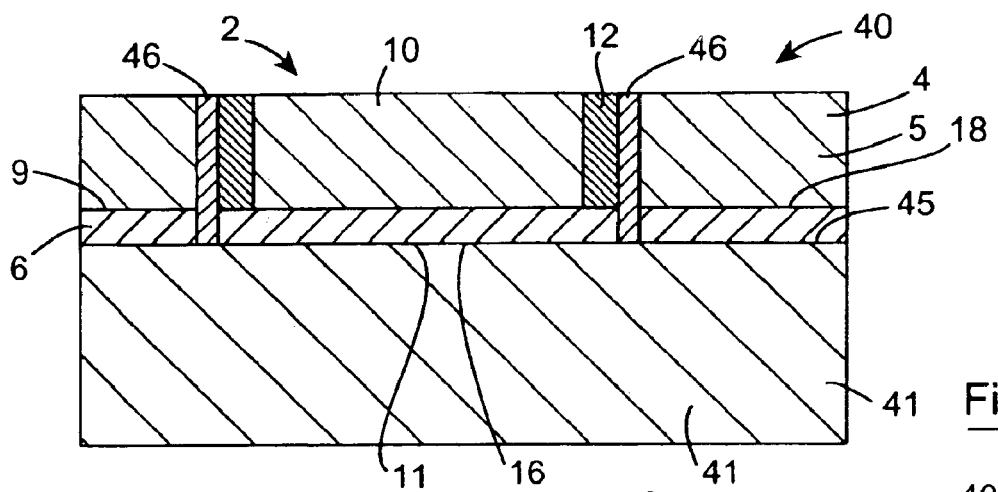
FIG. 12 is a transverse cross-sectional side elevational view of the semiconductor substrate of FIG. 11 on the line XII—XII of FIG. 11.
Figure 11:
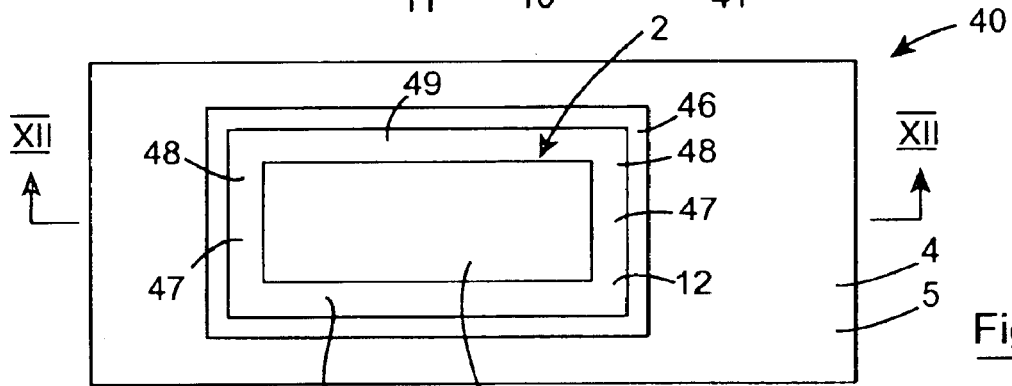
FIG. 11 is a top plan view of a semiconductor substrate according to another embodiment of the invention having an SOI formed therein.
Figure 14:
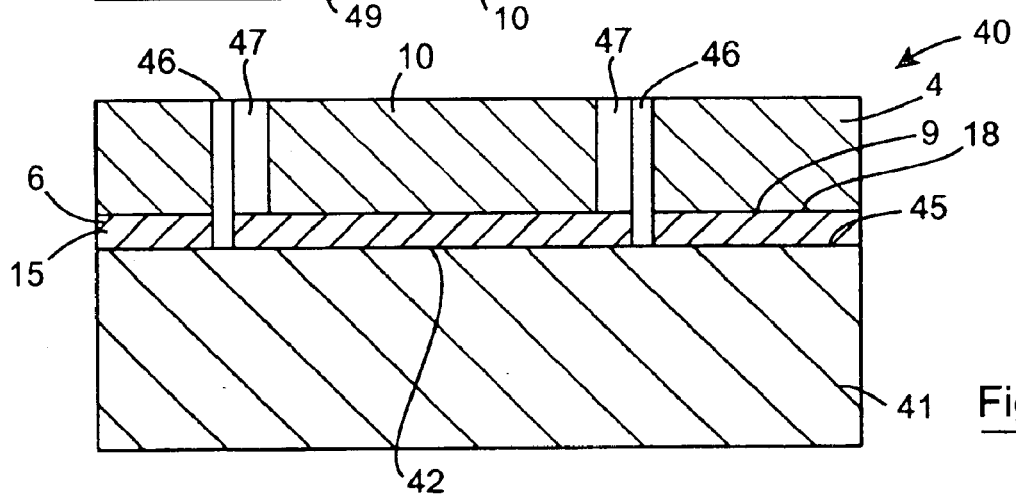
FIG. 14 is a view similar to FIG. 12 of the semiconductor substrate also being formed.
Figure 13:
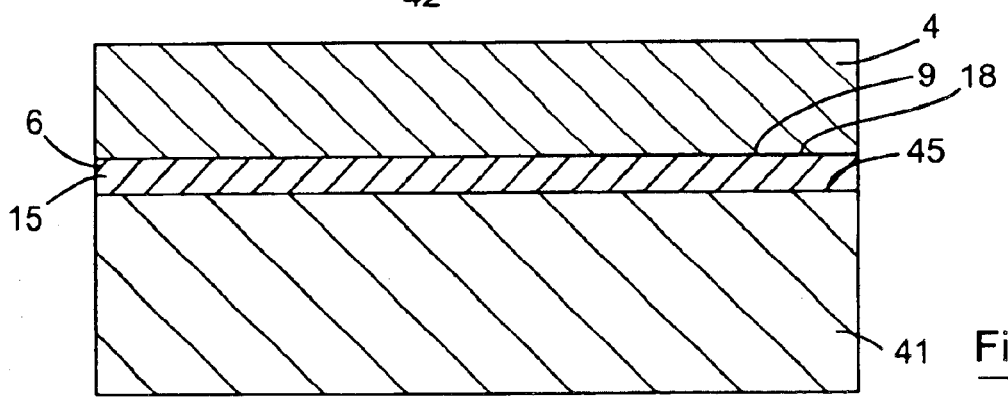
FIG. 13 is a view similar to FIG. 12 of the semiconductor substrate of FIG. 11 being formed.

Once the etch stop forming trench 33 has been filled with oxide, two communicating openings 34 are etched by an anisotropic RIE etch into the first wafer 4 to the bond interface 9, see FIGS. 9 and 10. The communicating openings 34 subsequently form two of the legs of the electrical isolation trench 12. The portion 31 of the selectively etchable portion 15 is etched by a wet etch through the communicating openings 34 to form the buried cavity 16, and the etch stop formed by the oxide filled etch stop forming trench 33 limits the etching of the selectively etchable portion 15 to the area of the portion 31 in order to form the buried cavity 16.

Thereafter the buried cavity 16 is filled with an oxide as already described through the communicating openings 34 to form the buried insulating layer 11. During filling of the buried insulating layer 11 with the oxide, the communicating openings 34 which form the two opposite legs 35 of the isolation trench 12 may be simultaneously lined with oxide.

Once the formation of the buried insulating layer 11 has been completed, the portion 10 of the first wafer 4 which is to form the SOI 2 is supported, and the remaining two legs 36 of the isolation trench 12 are then etched into the first wafer 4 to the buried insulating layer 11, and appropriately filled with an electrical isolation material as already described. In this case both the etch stop forming trench 33 and the isolation trench 12 both form electrical isolation of the portion 10 of the first wafer 4, which forms the SOI 2. However, in certain cases, it may be sufficient to use the etch stop forming trench 33 to form the electrical isolation trench, and in which case there would be no need to form the isolation trench 12. Thus, the communicating opening or openings could be formed in any desired location in the portion 10 of the first wafer 4.

Thereafter, the semiconductor substrate 30 may be further processed for forming semiconductor electronic devices and/or MEMS devices.

Referring now to FIGS. 11 to 14, there is illustrated a semiconductor substrate according to a further embodiment of the invention, indicated generally by the reference numeral 40. The semiconductor substrate 40 is somewhat similar to the semiconductor substrate 1 of FIGS. 1 to 6, and similar components are identified by the same reference numerals. However, in this embodiment of the invention the semiconductor substrate 40 is formed of three wafers, namely, the first wafer 4, the second wafer 6, and a third wafer 41 each of single crystal silicon. The first wafer 4 is similar to the first wafer 4 of the semiconductor substrate 1, and in this embodiment of the invention the third wafer 41 acts as the handle layer 7. The second wafer 6 is of p type material, and is entirely doped to be p+, to be selectively etchable. The doping is carried out during crystal growth. The second wafer 6 is directly bonded to the third wafer along a bond interface 45 by high temperature anneal bonding. In this embodiment of the invention the second wafer 6 forms the selectively etchable portion 15, a portion 42 of which is etched to form the buried cavity 16, which in turn is filled with an electrically insulating material to form the buried insulating layer 11. Prior to bonding the second and third wafers 6 and 41 the respective surfaces of the two wafers 6 and 41 may be ground and polished if necessary to form good bond surfaces. When bonded to the third wafer 41 the second wafer 6 is ground to the desired depth, in other words, to a depth corresponding to the desired depth of the buried insulating layer 11.

After the second wafer 6 has been ground and polished to the desired depth, the first wafer 4 is bonded to the second wafer 6 by high temperature anneal bonding as already described with reference to the semiconductor substrate 1 to form the bond interface 9. Thereafter an etch stop forming trench 46 similar to the etch stop forming trench 33 of the semiconductor substrate 30 of FIGS. 7 to 10 is etched through the first wafer 4 into the second wafer 6 to the bond interface 45 between the second and third wafers 6 and 41. The etch stop forming trench 46 is filled with oxide, which may be deposited or thermally grown, in order to define the area 42 of the second wafer 6 which is to be etched in order to form the buried cavity 16. A pair of communicating openings 47 similar to the communicating openings 34 of the semiconductor substrate 30 are etched through the first wafer 4 to the bond interface 9, and the portion 42 of the second wafer 6 is then etched by a suitable wet etch through the two communicating openings 47 to form the laterally extending buried cavity 16. Thereafter the buried cavity 16 is filled with an oxide as already described to form the buried insulating layer 11. The communicating openings 47 form two legs 48 of the isolation trench 12, and the remaining two legs 49 of the isolation trench 12 are then formed and filled with an electrical insulating material, for example, oxide as already described, or the isolation trench 12 may be partially filled with oxide and then with polysilicon. Alternatively, if the etch stop forming trench is of sufficient width it may act solely as the isolation trench 12.

Thereafter the semiconductor substrate 40 may be further processed for forming semiconductor electronic devices and/or MEMS devices.

Figure 15:
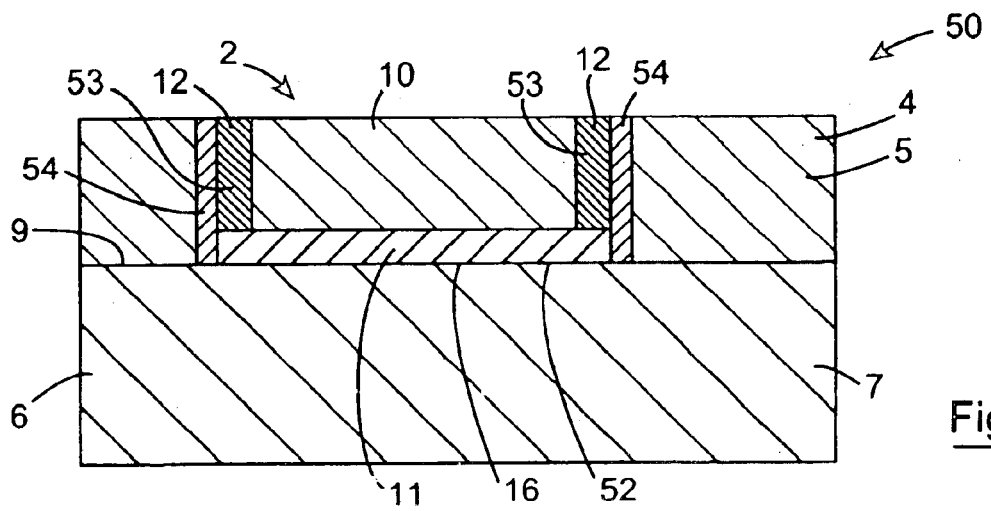
FIG. 15 is a transverse cross-sectional side elevational view similar to FIG. 2 of a semiconductor substrate according to another embodiment of the invention.
Figure 3:
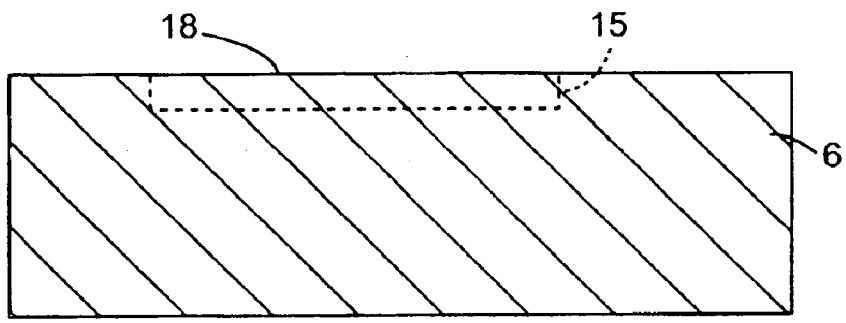
FIG. 3 is a transverse cross-sectional side elevational view of a portion of the semiconductor substrate of FIG. 1.
Figure 16:
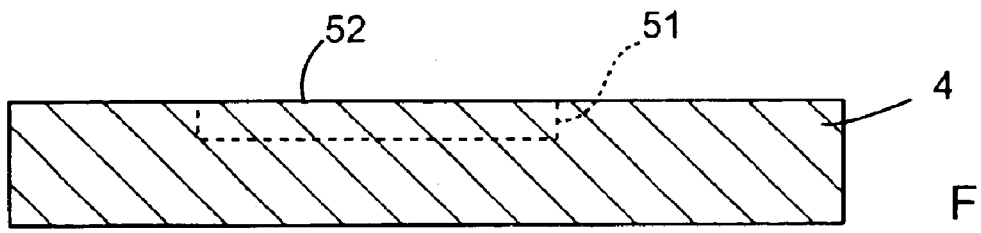
FIG. 16 is a transverse cross-sectional side elevational view of a portion of the semiconductor substrate of FIG. 15 being formed.
Figure 19:
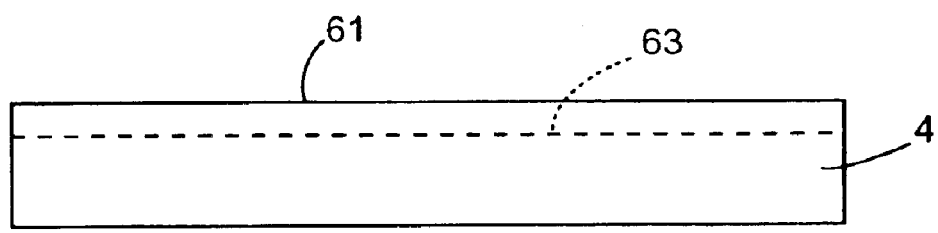
FIG. 19 is a side elevational view of a portion of the semiconductor substrate of FIG. 17.
Figure 20:
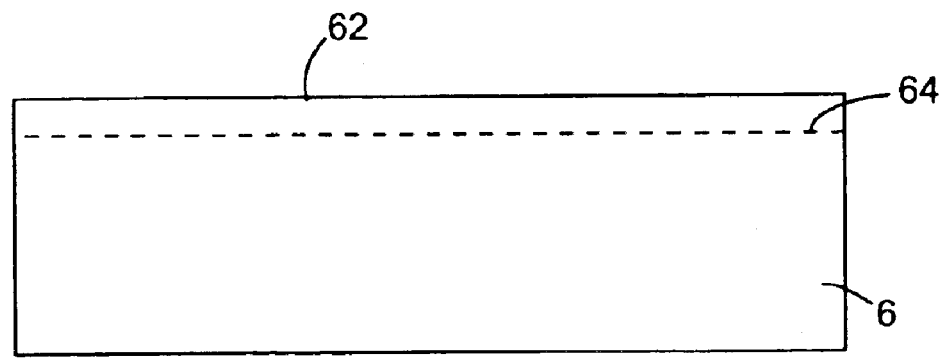
FIG. 20 is a side elevational view of another portion of the semiconductor substrate of FIG. 17.

Referring to FIGS. 15 and 16, there is illustrated a semiconductor substrate according to another embodiment of the invention, indicated generally by the reference numeral 50. The semiconductor substrate 50 is substantially similar to the semiconductor substrate 1 and similar components are identified by the same reference numerals. The main difference between the semiconductor substrate 50 and the semiconductor substrate 1 is that the buried insulating layer 11 in this embodiment of the invention is formed in the first wafer 4 beneath the portion 10 of the first wafer 4 which is to form the partial SOI 2. Prior to bonding the first and second wafers 4 and 6, a selectively etchable portion 51 similar to the selectively etchable portion 15 of the semiconductor substrate 1 is formed in the first wafer 4 through a surface 52 thereof for facilitating selective etching of the first wafer 4 to form the buried cavity 16 therein. The portion 51 is doped to be a p+ region, similar to the portion 15 of the semiconductor substrate 1, and the area and depth of the portion 51 is similar to the desired area and depth of the buried insulating layer 11. After forming the portion 51 in the first wafer 4, the first and second wafers 4 and 6 are directly bonded together with the surface 52 of the first wafer 4 abutting a corresponding surface of the second wafer 6 to form the bond interface 9. In this embodiment of the invention two communicating openings 53 similar to the communicating openings 34 of the semiconductor substrate 30 are etched into the first wafer 4 to the selectively etchable portion 51 for facilitating selective etching of the portion 51 to form the buried cavity 16. However, prior to etching the two communicating openings 53 an etch stop forming trench 54 similar to the etch stop forming trench 33 of the semiconductor substrate 30 is formed in the first wafer 4 to the bond interface 9 around the portion 10 which is to form the partial SOI 2, in order to avoid any danger of lateral under-etching of the first wafer 4 on the sides of the communicating openings 53 away from the portion 10 of the first wafer 4 during etching of the portion 51. The etch stop forming trench 54 is filled with oxide as already described, and the two communicating openings 53 are then etched in the first wafer 4 to the selectively etchable portion 51.

Thereafter the selectively etchable portion 51 is etched through the communicating openings 53 to form the buried cavity 16, and the buried cavity 16 is then filled with oxide to form the buried insulating layer as already described. The communicating openings 53 form two legs of the electrical isolation trench 12, and the remaining two legs (not shown) are then etched into the first wafer 4 to the buried insulating layer 11 to form the isolation trench 12 which is then filled as already described.

Otherwise, the semiconductor substrate 50 is similar to the semiconductor substrate 1, and thereafter may be further processed for forming semiconductor electronic devices and/or MEMS devices.

Referring now to FIGS. 17 to 20, there is illustrated a semiconductor substrate according to a still further embodiment of the invention, indicated generally by the reference numeral 60. The semiconductor substrate 60 is substantially similar to the semiconductor substrate 1, and similar components are identified by the same reference numerals. The main difference between the semiconductor substrate 60 and the semiconductor substrate 1 is that in this embodiment of the invention both the first and second wafers 4 and 5 are p type wafers and both have been ion implanted through respective surfaces 61 and 62, respectively, to form respective portions 63 and 64 as p+ regions to be selectively etchable. The selectively etchable portions 63 and 64 extend over the entire bond interface 9 adjacent thereto, and are formed to respective depths in the first and second wafers 4 and 6 so that the combined depths of the selectively etchable portions 63 and 64 correspond to the desired depth of the buried insulating layer 11. Alternatively, after forming the selectively etchable portions 63 and 64, the surfaces 61 and 62 of the first and second wafers 4 and 6 may be ground and polished to provide a combined depth of the selectively etchable portions 63 and 64 to correspond to the desired depth of the buried insulating layer 11. Once the selectively etchable portions 63 and 64 of the first and second wafers 4 and 6 are of the desired depth, the first and second wafers are bonded together with the surfaces 61 and 62 abutting each other to form the bond interface 9. The bonding of the first and second wafers 4 and 6 is carried out as already described by high anneal temperature anneal bonding.

Once the first and second wafers 4 and 6 have been bonded together, formation of the buried cavity 16, and in turn the buried insulating layer 11 is similar to that already described with reference to the semiconductor substrate 30. An etch stop forming trench 65 is formed through the first wafer 4 into the selectively etchable portions 63 and 64 to define a portion 66 of the portions 63 and 64 to be etched to form the buried cavity 16. Two communicating openings 68 are then etched into the first wafer 4 to the selectively etchable portion 63 of the first wafer 4, and the selectively etchable portions 63 and 64 are etched to form the buried cavity 16. Thereafter the buried insulating layer 11 is formed in the buried cavity 16. The communicating openings 68 form two legs of the isolation trench 12, and the remaining two legs 69 of the isolation trench 12 are then formed and filled as already described.

Otherwise the semiconductor substrate 60 is similar to the semiconductor substrate 1 and the semiconductor substrate thereafter is ready for further processing for forming electronic and MEMS devices therein.

Figure 21:
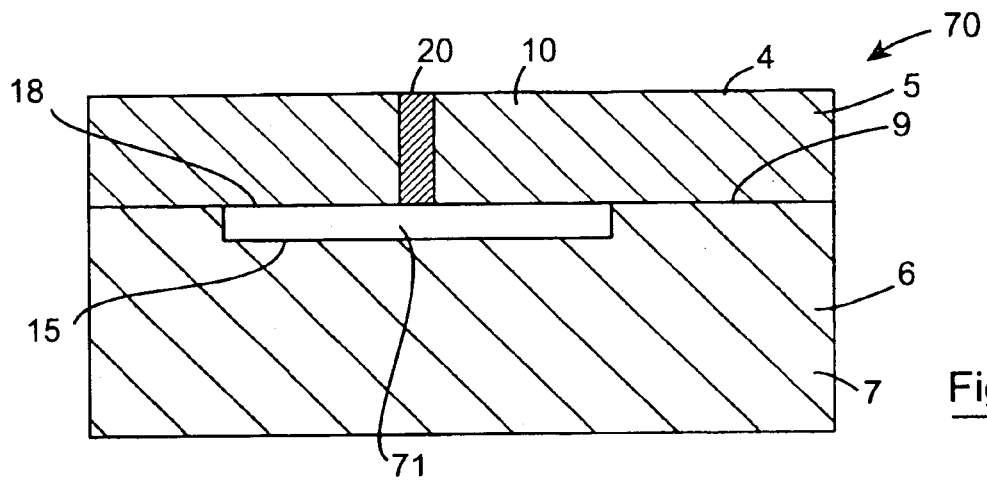
FIG. 21 is a transverse cross-sectional side elevational view of a semiconductor substrate according to a still further embodiment of the invention having a buried cavity formed therein.
Figure 18:
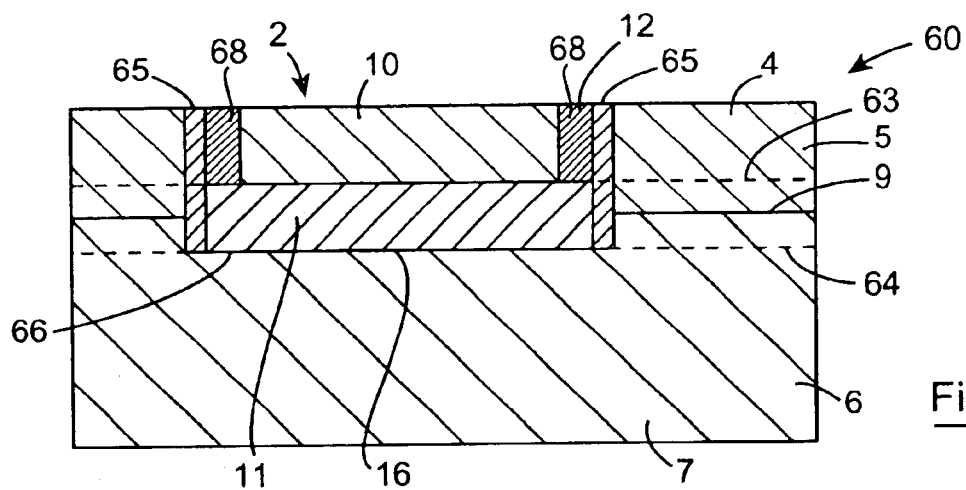
FIG. 18 is a transverse cross-sectional side elevational view of the semiconductor substrate of FIG. 17 on the line XVIII—XVIII of FIG. 17.
Figure 17:
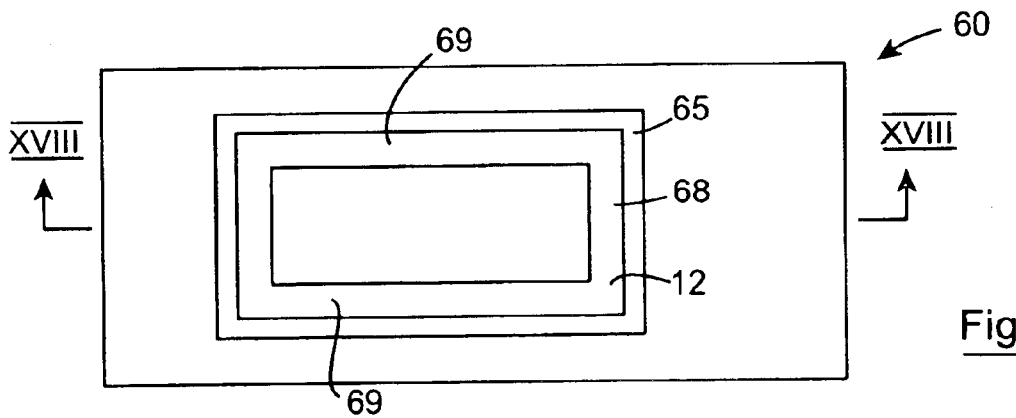
FIG. 17 is a top plan view of a semiconductor substrate according to a further embodiment of the invention having an SOI formed therein.

Referring now to FIG. 21, there is illustrated a semiconductor substrate according to a still further embodiment of the invention, indicated generally by the reference numeral 70. The semiconductor substrate 70 is somewhat similar to the semiconductor substrate 1 and similar components are identified by the same reference numerals. The main difference between the semiconductor substrate 70 and the semiconductor substrate 1 is that in this embodiment of the invention a partial SOI is not formed in the semiconductor substrate 70, but rather only a buried cavity 71 is formed in the semiconductor substrate 70. The first and second wafers 4 and 6 are similar to the first and second wafers of the semiconductor substrate 1. A portion 15 of the second wafer 6 is doped to be p+ as already described with reference to the semiconductor substrate 1 to be selectively etchable. The doping is carried out until the area and depth of the portion 15 corresponds to the desired area and depth of the buried cavity 71. The first and second wafers are then bonded together along the bond interface 9 as already described and a communicating opening 20 is etched through the first wafer 4 to the bond interface 9. The selectively etchable portion 15 is etched as already described to form the buried cavity 71. On completion of etching of the portion 15 to form the buried cavity 71, the communicating opening 20 may be filled with any suitable filling material, for example, an oxide, polysilicon or the like, or the communicating opening 20 may be left open, depending on the device or devices which are to be formed in the portion 10 of the first wafer 4 above the cavity. If MEMS devices are to be formed in the portion 10 of the first wafer 4, the communicating opening 20 may form part of a MEMS device, or alternatively, the communicating opening 20 may be of a shape and pattern to form part of the MEMS devices, to be subsequently formed. However, if the communicating opening 20 is to be filled, during filling of the communicating opening 20 the interior surface of the cavity 71 will also be lined with the filling material. Accordingly, in order to minimise the depth of the lining formed on the inner surface of the cavity 71 during filling of the communicating opening 20, the communicating opening 20 is formed to be of relatively small diameter, in order that it will be closed relatively quickly with the filling material before excessive lining of the inner surfaces of the cavity 71 occurs. Additionally, the communicating opening 20 may be left open if access would subsequently be required to the buried cavity during further processing of the semiconductor substrate 70.

Once the communicating opening 20 has been closed and filled, or left open as the case may be, the semiconductor substrate 70 is ready for further processing for formation of electronic and/or MEMS devices therein. The semiconductor substrate 70 is suitable for many uses, and the portion of the semiconductor substrate with the buried cavity formed therein may be used as a pressure sensor, whereby the portion 10 of the first wafer extending over the buried cavity 71 may form a part of or all of a membrane of the pressure sensor. MEMS devices such as accelerometers, gyroscopes, mirrors or the like may also be formed in the semiconductor substrate 70.

While the communicating openings in the first wafers of the semiconductor substrates have been described as being etched to the selectively etchable portions which are to be etched to form the buried cavity, it will be appreciated that the communicating openings may be etched down to the bond interface if desired.

While the second wafers have been described as being of p type material, and have been doped to form the portions as p+ regions, it is envisaged that the second wafers may be of n type material, and in which case, they would be doped to form portions as n+ regions, which would be selectively etchable. Similarly, where the buried insulating layer or buried cavity is to be formed partly or wholly in the first wafer, it is envisaged that the first wafer may be of n type material and the portion to be etched to form the buried cavity may be doped to be an n+ region. Where the first and/or second wafers are of n type material, the n+ regions would be formed by doping with any one or more of the following dopants, namely, phosphorous, arsenic, antimony, or species thereof.

While the semiconductor substrates of FIGS. 1 to 20 have been described as having a single SOI formed therein, it will be readily apparent to those skilled in the art that the semiconductor substrates may be formed with a plurality of discrete SOIs formed therein.

While the doping to form the selectively etchable portions has been described as being carried out by ion implantation, the doping may be carried out by atom diffusion, or any other suitable doping processes, for example, solid state or gaseous diffusion which will be well known to those skilled in the art.

While the communicating opening or openings in the first wafers have been described as being formed by etching and by a particular type of etching, the communicating openings may be formed by any other suitable means. Similarly, the etch stop forming trenches may be formed by other suitable means.

While the buried insulating layers have been described as being formed by a deposited oxide layer, the buried insulating layers may be of any other suitable material, which may be deposited or grown, and where formed by an oxide layer, the oxide layer may be deposited or grown, and if grown would typically be thermally grown. Additionally, while the buried cavities have been described as being filled with the insulating material to form the buried insulating layer, in certain cases, it is envisaged that the cavities may only be partially filled with an electrical insulating material in order to form the buried insulating layer. Indeed, in certain cases, the cavities may be provided unfilled to form an air insulating layer.

While the etch stop forming trenches have been described as being filled with an oxide etch stop material, the etch stop forming trenches may be filled with any other suitable etch stop material, and in certain cases, it is envisaged that the etch stop forming trenches may only be partially filled with the etch stop forming material. For example, in certain cases it is envisaged that the etch stop forming trenches may only be filled to a depth just greater than the depth of the selectively etchable portions.

Additionally, while the semiconductor substrate of FIG. 21 has been described as being formed with a single buried cavity, it is envisaged that semiconductor substrates according to the invention may be formed with a plurality of discrete buried cavities.

While in some of the embodiments of the invention the selectively etchable portion has been formed in the second wafer, and in others, the selectively etchable portion has been formed in the first wafer, and in another one of the embodiments of the invention the selectively etchable portions are formed in both the first and second wafers, it will be readily apparent to those skilled in the art that any combination of forming the selectively etchable portions in the first and/or second wafers may be used in the formation of the partial SOIs, or in the formation of semiconductor substrates with one or more cavities formed therein.

Although not described, it is envisaged that the first and second wafers will be appropriately doped prior to bonding for facilitating fabrication of electronic devices and MEMS devices to be subsequently formed in the semiconductor substrates after the partial SOIs or buried cavities, as the case may be, have been formed in the semiconductor substrates.

While a particular type of wet etch has been described for etching the selectively etchable portions for forming the buried cavities, any other suitable etch which is selective to highly doped regions may be used, for example, a potassium hydroxide aqueous solution.

Additionally, it will be appreciated that while the buried cavities of the semiconductor substrates of FIGS. 1 to 20 have been described as being laterally extending cavities of depth sufficient to form a buried insulating layer of an SOI, the buried cavities may be of any desired depth or shape, and the appropriate one or ones of the first and second wafers would be treated to be selectively etchable to form the buried cavities of the desired depth and shape. Similarly, the buried cavity of the semiconductor substrate of FIG. 21 may be of any desired shape or depth.

What is claimed is:

1. A method for forming a buried cavity in a semiconductor substrate formed by at least a first wafer and a second wafer both of semiconductor material directly bonded along a bond interface, the method comprising the steps of:

treating one of the first and second wafers to be selectively etchable adjacent a surface thereof to form a selectively etchable portion prior to bonding of the first and second wafers, bonding the first and second wafers together with the surface of the one of the first and second wafers adjacent which the portion of the wafer is selectively etchable forming with a surface of the other of the first and second wafers the bond interface, forming a communicating opening through the first wafer to the selectively etchable portion, and etching the selectively etchable portion to form the buried cavity beneath the first wafer.

2. A method as claimed in claim 1 in which the one of the first and second wafers which is treated to be selectively etchable is treated through the surface thereof which is to form the bond interface.

3. A method as claimed in claim 1 in which the one of the first and second wafers which is treated to be selectively etchable is treated by doping.

4. A method as claimed in claim 3 in which the one of the first and second wafers which is treated to be selectively etchable is doped by ion implantation through the surface which is to form the bond interface.

5. A method as claimed in claim 3 in which the one of the first and second wafers which is treated to be selectively etchable is doped by atom diffusion through the surface which is to form the bond interface.

6. A method as claimed in claim 3 in which the one of the first and second wafers which is treated to be selectively etchable is of p type material, and the wafer is doped to form the selectively etchable portion as a p+ region.

7. A method as claimed in claim 6 in which the one of the first and second wafers which is to be treated to be selectively etchable is doped by boron, or species thereof.

8. A method as claimed in claim 3 in which the one of the first and second wafers which is treated to be selectively etchable is of n type material, and the wafer is doped to form the selectively etchable portion as a n+ region.

9. A method as claimed in claim 8 in which the one of the first and second wafers which is treated to be selectively etchable is doped by a dopant selected from one or more of the following dopants:

phosphorous, arsenic, and antimony, or species thereof.

10. A method as claimed in claim 3 in which the one of the first and second wafers which is treated to be selectively etchable is doped at a level greater than $10^{18}$ atoms per cubic centimeter.

11. A method as claimed in claim 1 in which the one of the first and second wafers which is treated to be selectively etchable is treated so that the depth of the selectively etchable portion corresponds to the desired depth of the buried cavity.

12. A method as claimed in claim 1 in which the one of the first and second wafers which is treated to be selectively etchable is treated so that the area of the selectively etchable portion corresponds to the desired area of the buried cavity.

13. A method as claimed in claim 1 in which the one of the first and second wafers which is treated to be selectively etchable is treated so that the area of the selectively etchable portion extends substantially over the entire bond interface.

14. A method as claimed in claim 1 in which the second wafer is treated to be selectively etchable in its entirety, and a third wafer of semiconductor material is bonded to the second wafer so that the second wafer is sandwiched between the third wafer and the first wafer.

15. A method as claimed in claim 14 in which the third wafer is directly bonded to the first wafer.

16. A method as claimed in claim 1 in which the second wafer is treated to be selectively etchable.

17. A method as claimed in claim 1 in which the first wafer is treated to be selectively etchable.

18. A method as claimed in claim 1 in which the first and the second wafers are treated to be selectively etchable, and the first and second wafers are bonded together with their respective surfaces which are adjacent the portions thereof which are selectively etchable forming the bond interface.

19. A method as claimed in claim 1 in which the selectively etchable portion is etched by a wet etch to form the buried cavity.

20. A method as claimed in claim 1 in which the communicating opening is formed in the first wafer by etching.

21. A method as claimed in claim 20 in which the communicating opening is etched in the first wafer by a reactive ion etch (RIE).

22. A method as claimed in claim 1 in which an etch stop is formed in the selectively etchable portion for defining the area of the buried cavity prior to etching of the selectively etchable portion for limiting the etch in a lateral direction to form the buried cavity.

23. A method as claimed in claim 22 in which the etch stop is formed in the selectively etchable portion after bonding of the wafers.

24. A method as claimed in claim 23 in which an etch stop forming trench is formed through one of the wafers into the selectively etchable portion, and an etch stop material is located in at least the portion of the etch stop forming trench in the selectively etchable portion for forming the etch stop.

25. A method as claimed in claim 24 in which the etch stop forming trench is formed by etching.

26. A method as claimed in claim 24 in which the etch stop forming trench is etched by an RIE etch.

27. A method as claimed in claim 24 in which the etch stop forming trench is formed in the first wafer.

28. A method as claimed in claim 1 in which the communicating opening is formed in the first wafer adjacent the centre of the area of the first wafer which is to be above the buried cavity, and the buried cavity is formed radiating laterally outwardly from and around the communicating opening.

29. A method as claimed in claim 1 in which a pair of communicating openings are formed in the first wafer spaced apart from each other.

30. A method as claimed in claim 1 in which the buried cavity is at least partially filled with an electrically insulating material for forming a buried insulating layer beneath the first wafer for forming with a portion of the first wafer above the buried insulating layer a semiconductor-on-insulator (SOI).

31. A method as claimed in claim 30 in which the electrically insulating material with which the buried cavity is at least partially filled is an oxide.

32. A method as claimed in claim 30 in which the electrically insulating material with which the buried cavity is at least partially filled is deposited in the buried cavity.

33. A method as claimed in claim 30 in which the electrically insulating material with which the buried cavity is at least partially filled is grown in the buried cavity.

34. A method as claimed in claim 1 in which an electrical isolation trench is formed in the first wafer for electrically isolating an area of the first wafer above the buried cavity.

35. A method as claimed in claim 34 in which the electrical isolation trench is at least partly filled with an electrically insulating material.

36. A method as claimed in claim 34 in which the communicating opening is located to form a part of the electrical isolation trench.

37. A method as claimed in claim 36 in which the portion of the electrical isolation trench which is not formed by the communicating opening, is formed after filling of the buried cavity with the electrically insulating material.

38. A method as claimed in claim 1 in which each communicating opening is at least partially filled with an electrically insulating material.

39. A method as claimed in claim 1 in which each communicating opening is filled with an electrically insulating material.

40. A method as claimed in claim 1 in which each communicating opening is at least partially filled with polysilicon.

41. A method as claimed in claim 1 in which each communicating opening is filled with polysilicon.

42. A method as claimed in claim 1 in which a plurality of discrete buried cavities are formed in the semiconductor substrate.

43. A method as claimed in claim 42 in which at least some of the buried cavities are at least partially filled with the electrical insulating material for forming a plurality of discrete SOIs.

44. A method as claimed in claim 1 in which the first wafer is thinned after the buried cavity has been formed.

45. A method as claimed in claim 1 in which each wafer is of single crystal silicon material.

46. A semiconductor substrate having a buried cavity therein, the semiconductor substrate being formed by the method as claimed in claim 1.

47. A semiconductor substrate having an SOI formed therein, the SOI being formed by the method as claimed in claim 30.

\* \* \* \* \*